United States Patent [19]
Lingle et al.

[11] Patent Number: 5,229,194
[45] Date of Patent: Jul. 20, 1993

[54] HEAT TREATABLE SPUTTER-COATED GLASS SYSTEMS

[75] Inventors: Philip J. Lingle, Lambertville; Raymond Nalepka, Westland; Klaus W. Hartig, Brighton, all of Mich.

[73] Assignee: Guardian Industries Corp., Northville, Mich.

[21] Appl. No.: 804,017

[22] Filed: Dec. 9, 1991

[51] Int. Cl.$^5$ ............................................. B32B 17/06
[52] U.S. Cl. .................... 428/216; 359/359; 359/580; 428/432; 428/433; 428/472; 428/698; 428/699; 428/701; 428/702; 428/913
[58] Field of Search ............... 428/216, 432, 433, 467, 428/472, 698, 699, 701, 697, 702, 913; 359/359, 360, 580, 589

[56] References Cited

U.S. PATENT DOCUMENTS

| | | | |
|---|---|---|---|
| 4,450,201 | 5/1984 | Brill et al. | 428/698 |
| 4,546,050 | 10/1985 | Amberger et al. | 428/630 |
| 5,085,926 | 2/1992 | Iida et al. | 428/216 |

FOREIGN PATENT DOCUMENTS 63-242948  10/1988  Japan.

Primary Examiner—A. A. Turner
Attorney, Agent, or Firm—Myers, Liniak & Berenato

[57] ABSTRACT

A heat treatable sputter-coated layer system for glass substrates may be applied before heat treatment if the layer system includes a metallic layer of nickel or a high nickel content alloy covered by a separate layer of metallic silicon or an oxide of nickel or the high nickel content alloy, which in turn is covered by a protective metal oxide such as stoichiometric $SnO_2$.

14 Claims, 2 Drawing Sheets

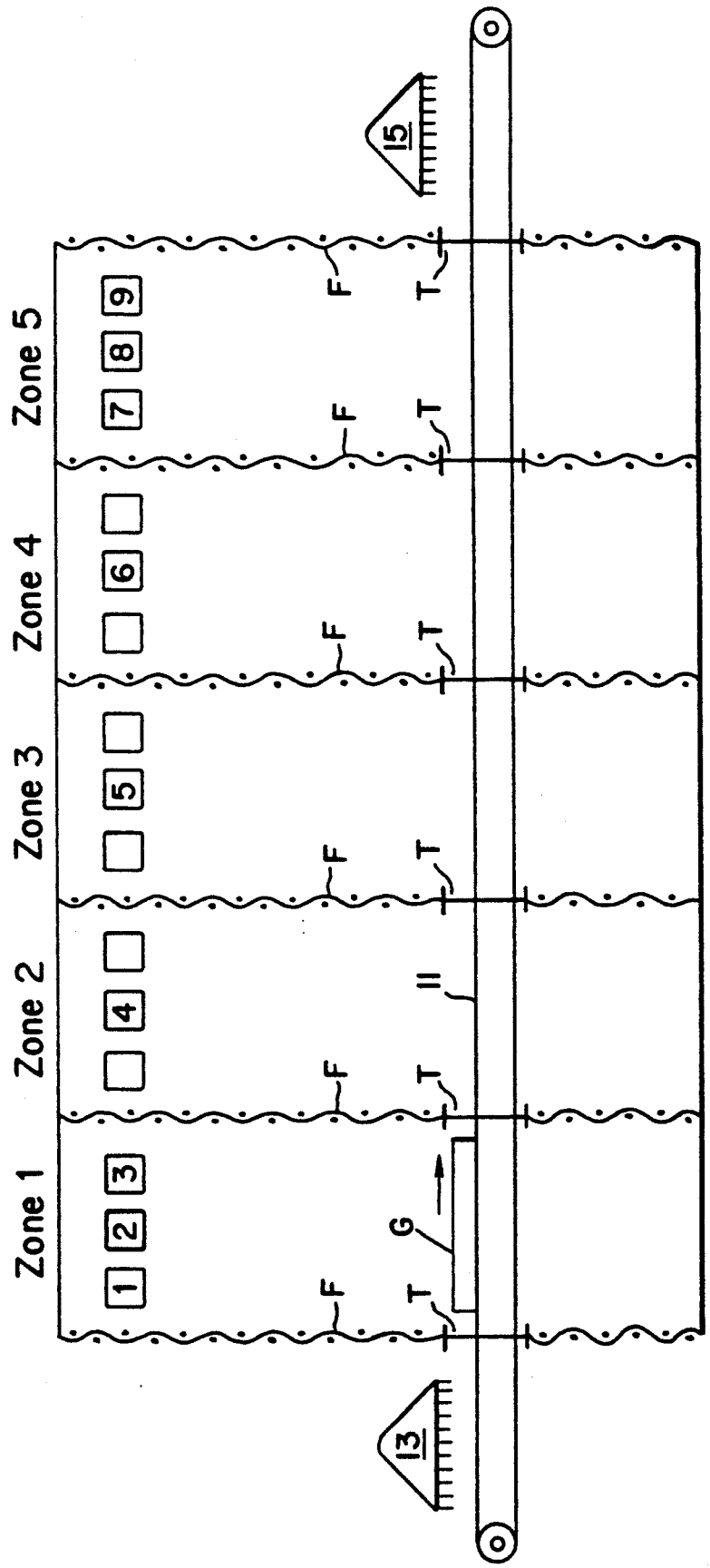

HEAT TREATABLE SPUTTER-COATED GLASS SYSTEMS

FIELD OF THE INVENTION

This invention relates to glasses provided with specific coatings which may be thereafter heat treated at temperatures sufficiently elevated to bend, heat strengthen, and/or temper the glass. This invention finds particular utility in architectural and automotive glass production.

BACKGROUND OF THE INVENTION

The popularity of metal and metal oxide coated glasses in architectural and automotive design is well known. As reported prolifically in patent and other literature, such glasses, through the manipulation of the coating's layering system, usually by choice of metals and/or metal oxides and/or thicknesses, can usually achieve, quite acceptably, the degree of reflectance, transmittance, emissivity and durability, as well as the color desired. See, for example, in this respect, U.S. Pat. Nos. 3,935,351; 4,413,877; 4,462,883; 3,826,728; 3,681,042; 3,798,146; and 4,594,137 just to name a few.

It has also been well reported that While several reasonably acceptable techniques exist for applying such coatings, one of the most efficacious, and thus preferred, is the well known technique referred to as "magnetically enhanced sputter-coating". Such a technique is reported in U.S. Pat. No. 4,166,018, a recognized fundamental teaching on the subject. (See also, Munz et al. "Performance and Sputtering Criteria of Modern Architectural Glass Coatings" SPIE Vol. 325 Optical Thin Films, 1982 pp. 65–73.)

While efficacious for many known layer systems, the use of sputter-coating has been known to result in mechanical durability qualities less than that achieved by another known method called the "pyrolytic" technique. As a reverse function, however, sputter-coated systems often achieve better infrared reflectance than typical pyrolytic coatings. Also, sputter-coated glasses have generally been recognized as having superior optical and thermal performance characteristics than pyrolytically formed coatings, such as having improved coating uniformity, good emittance, and better solar performance characteristics. It is clear, that if a sputter-coating technique could be devised for a particular coating system wherein the mechanical durability qualities of the sputter-coated system could approach or equal that of a pyrolytic technique, while at the same time achieving the enhanced benefits of sputter-coated technology, a significant step forward in the art would be made. The subject invention described below, in the preferred embodiments thereof, achieves this long-felt need in the art.

In recent years, the popularity of coated glasses has occasioned numerous attempts at achieving a coated glass article which prior to heat treatment can be coated, and which thereafter, can be heat treated without adversely changing the characteristics of the coated glass article. One of the reasons for this is, for example, that it can be extremely difficult to achieve a uniform coating on an already bent piece of glass. It is well known that if a flat glass surface can be coated and thereafter bent, much simpler techniques can be used to get a uniform coating than if the glass has been previously bent.

Certain techniques have been developed in the past for making heat treatable glass articles which may then, and thereafter, be heat treated by way of tempering, bending, or a technique known as "heat strengthening". Generally speaking, many of these prior techniques have suffered from not being truly heat treatable at the higher elevated temperatures necessary to achieve economic bending, tempering, and/or heat strengthening (i.e. 1150° F.–1450° F.). In short, such techniques have often suffered from a need to keep the temperature at approximately 1100° F. or less in order to achieve heat treatability without adversely affecting the glass or its substrate.

In this respect, however, two of the inventors of this invention have previously invented and offered for sale certain prior art coating systems which can be heat treated successfully at the higher, more elevated temperatures aforesaid, to achieve tempering, bending, or heat strengthening. Generally speaking, these prior art coating compositions find their uniqueness in a layering system which employs as a metallic layer, a high nickel content alloy which, in its preferred form, is an alloy known as Haynes 214, consisting essentially of 75.45% Ni, 4.00% Fe, 16.00% Cr, 0.04% C, 4.50% Al, and 0.01% Y (percentages are by weight). By using a high nickel content alloy, such as Haynes 214, and overcoating it with stoichiometric tin oxide (Sn $O_2$) either alone or with other layers (such as an undercoating of the same stoichiometric tin oxide and/or an intermediate layer of aluminum between the top Sn $O_2$ layer and the high content nickel alloy), it was found that heat treatability of glass articles at elevated temperatures of from approximately 1150° F.–1450° F. from about 2–30 minutes, could be achieved without substantial degradation of color, durability, chemical resistance, emissivity, reflectance or transmittance. These compositions therefore constituted a significant improvement over prior heat treatable systems such as those disclosed in the following U.S. Pat. Nos.: 4,790,922; 4,816,034; 4,826,525; 4,715,879; and 4,857,094.

In addition to the above disclosures in the aforesaid patents, the Leybold "Spectrum" windshield glass system TCC-2000 is also known. In this system, four or five layers of metals and metal oxides are employed to obtain a sputter-coated glass which, being somewhat heat treatable at temperatures up to 1100° F. may be used as a pre-coated glass for making bent or unbent, glass windshields, provided that rapid time limits are placed on the heat treatment. The layering from glass substrate outwardly usually includes a first layer of tin oxide, a second layer of nickel/chrome alloy (usually about 80/20), a third layer of silver, a fourth layer of the nickel/chrome alloy, and a fifth layer of tin oxide. In addition to the rather low upper limit on heat treatment temperatures and times, the resultant coatings are rather soft and exhibit such unacceptably low chemical resistance characteristics that they can realistically be used only on the inner surfaces of laminated glass windshields.

In the aforesaid U.S. Pat. No. 4,715,879 it is specifically taught that the layering system therein can not be achieved unless the protective layer of a metal oxide (e.g. tin oxide) be formed such that the oxide has an oxygen deficit (i.e. is non-stoichiometric). This, of course, requires delicate balancing in the manufacturing process. Heat treatability, in this respect, is also disclosed in U.S. Pat. No. 4,826,525. However, in this patent it is specifically taught that a layer of aluminum must be applied to achieve heat treatability.

The alloy most preferred for use as the high content nickel alloy (i.e. a nickel alloy having a nickel content greater than about 50% by weight) in the practice of this invention is an alloy produced by Haynes International Corporation known as Haynes Alloy No. 214. This alloy is a nickel-based, high temperature alloy that is known for its excellent resistance to oxidation, carburization, and chlorination. Its nominal chemical composition is as stated aforesaid. While this particular unique alloy, as well as nickel and/or other alloys thereof having a nickel content by weight of greater than about 50% have been found to be useful in the practice of the subject invention, it is not by the use of these alloys alone that the improvements achieved by the subject invention are realized. The improvements, instead, are realized from a unique layering system, as opposed to a particular layer in and of itself.

There are three different types of heat treatments that are generally employed in working glass for architectural or automotive purposes; namely, bending, tempering, and a lesser form of tempering called "heat strengthening" or "hardening". When bending without tempering conventional ¼" clear float glass, for example, times of 10–30 minutes at 1150° F. or more, are generally necessary to use. In heat strengthening or tempering such glasses, with or without bending, temperatures as high as about 1450° F. (e.g. 1150° F.–1450° F.) are normally employed for about 2–5 minutes. As can be seen, there are significant drawbacks to many of the known or reported prior art techniques which are limited in their upper temperatures, for providing heat treatable, coated glasses, particularly of the efficacious sputter-coated type. By the term "heat treatable" as used herein, therefore, is meant that the coated (layered) glass can undergo one or more of the above three treatments, and that in the preferred forms of this invention heat treatability can take place for the requisite periods of time at temperatures of from 1150° F.–1450° F.

Coated glasses for use in architectural or automotive design (e.g. vehicular privacy windows) generally have eight (8) characteristics which determine their efficacy and/or marketability: commercial feasibility, durability (mechanical resistance to abrasion), chemical resistance, long-term stability, emissivity, transmittance, reflectivity, and color. In prior systems, including those developed by two of the inventors herein, as reported hereinabove, some of the characteristics had to be significantly compromised in order to achieve the necessary degree of acceptability for the remaining characteristics. For example, in the case of the inventors' prior systems, while high temperature heat treatability was achieved, mechanical durability was not optimized. For this and other reasons, therefore, it is apparent that there exists a need in the art for a heat treatable, coated glass useful in architectural and/or automotive design which does not significantly compromise any of the above eight characteristics, and which preferably also may be heat treated (i.e. bent, tempered and/or heat strengthened) at the upper temperature ranges and times of such treatments. There is also a need for a coating which can be formed by sputter-coating techniques, but which also achieves the mechanical durability of pyrolytically formed coatings.

It is a purpose of this invention to fulfill the above-described needs, as well as other needs apparent to the skilled artisan from the following detailed description of this invention.

SUMMARY OF THE INVENTION

Generally speaking, this invention fulfills the above-described needs in the art by providing a heat treatable sputter-coated glass article comprising a glass substrate having thereon a layer system which includes:

(a) a substantially non-oxidized metallic layer formed of nickel or a nickel alloy having greater than about 50% by weight nickel;

(b) a metallic oxide protective layer wherein the metal in the metal oxide is different than the metal in layer (a); and (c) a separate layer of silicon or a metal oxide or nitride layer intermediate layers (a) and (b) wherein the metal in the metal oxide or nitride is nickel or a nickel alloy having greater than about 50% by weight nickel, and wherein layer (c) tightly bonds layer (a) to layer (b).

In certain preferred forms of this invention the aforesaid heat treatable glass article comprises a glass substrate having thereon a coating which includes:

(a) a first layer comprised of an oxide of a metal selected from the group consisting of tin, zinc, titanium, and alloys thereof;

(b) a second layer comprised of an oxide or nitride of a metal selected from the group consisting of nickel and a nickel alloy having at least about 50% by weight nickel;

(c) a third layer comprised of a metal selected from the group consisting of nickel and a nickel alloy having at least about 50% by weight nickel;

(d) a fourth layer comprised of an oxide or nitride of a metal selected from the group consisting of nickel and a nickel alloy having at least about 50% by weight nickel; and (e) a fifth layer comprised of an oxide of a metal selected from the group consisting of tin, titanium, and alloys thereof.

In particularly preferred forms of this invention all oxides formed are stoichiometric. For example, in certain preferred forms of this invention the above first and fifth layers consist essentially of a stoichiometric oxide of tin ($SnO_2$), while the second and fourth layers are stoichiometric oxides of the same metal which is employed in the metallic third layer.

Most preferably in this invention, the metal of the second, third and fourth layers constitutes the aforesaid Haynes Alloy No. 214. When this particular alloy is employed and the aforesaid layering system is used, the invention is found to have unique applicability in the areas of vehicular glass, particularly glass known as "privacy windows".

This invention also envisions within its scope a method of forming a heat treatable coated glass article which comprises sputter-coating onto the glass substrate in the sequence given below from glass outwardly, the following layers:

(a) an optional first layer comprised of an oxide of a metal selected from the group consisting of tin, zinc, titanium and alloys thereof;

(b) an optional second layer comprised of an oxide or nitride of a metal selected from the group consisting of nickel and a nickel alloy having at least about 50% by weight nickel;

(c) a third layer comprised of a metal selected from the group consisting of nickel and a nickel alloy having at least about 50% by weight nickel;

(d) a fourth layer comprised of metallic silicon or an oxide or nitride of a metal selected from the group consisting of nickel and a non-siliceous nickel alloy having at least about 50% by weight nickel; and (e) a fifth layer comprised of an oxide of a metal selected from the group consisting of tin, zinc, titanium and alloys thereof.

In certain preferred forms of this method, the sputter-coating of each of said oxide layers is conducted in an atmosphere sufficiently rich in oxygen so as to create substantially stoichiometric oxides. The preferred forms of the various layers are as set forth above in describing the heat treatable glass article envisioned within the scope of this invention.

Further included within the scope of this invention is a method for forming a coated, heat treated glass article comprising:

(a) forming a substantially non-oxidized metallic layer of nickel or an alloy having greater than about 50% by weight nickel;

(b) separately forming on layer (a) a metallic silicon or metal oxide layer wherein the metal in said oxide is nickel or an alloy having greater than about 50% by weight nickel;

(c) separately forming on layer (b) a protective layer of a substantially stoichiometric metallic oxide; and (d) thereafter heat treating said article by one of the aforesaid treatments within the definition of the term "heat treating".

As aforesaid, the preferred layering systems employed are those as described above. In particularly preferred embodiments of this invention this method of heat treatment includes carrying out this heat treatment at temperatures in the range of about 1150° F.–1450° F. for a time sufficient to effect the necessary heat treatment. These particularly preferred forms, of course, also include applying the coatings by way of sputter-coating, as aforesaid. It is also envisioned within the scope of this invention that various glasses may be employed, the preferred forms of the glass being float glass in untinted or tinted (e.g. green tinted) form.

This invention also envisions within its scope heat treated articles manufactured by the aforesaid methods of this invention. Such articles can take many shapes or forms, but in certain preferred embodiments constitute heat treated (tempered, heat strengthened, and/or bent) vehicular privacy windows exhibiting the necessary characteristics for such a commercial glass.

This invention will now be described with reference to certain embodiments thereof as illustrated in the following drawings:

IN THE DRAWINGS

FIG. 3 is a schematic of an Airco-Temescal five-zone architectural sputter-coater useful in carrying out an embodiment of this invention.

DETAILED DESCRIPTION OF THE INVENTION

Figure 1:
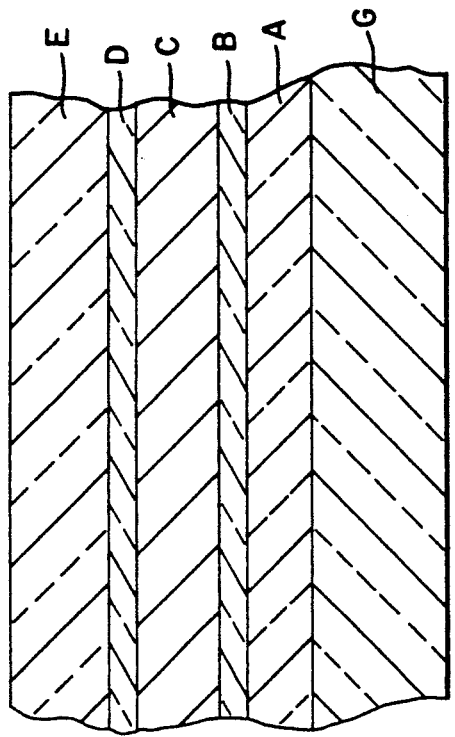
FIG. 1 is a partial, sectionalized view of a typical coating system as contemplated by this invention, applied to a glass substrate which may in the preferred embodiments be a vehicular privacy window.

With reference to FIG. 1, there is illustrated in side sectional view a typical example of a glass article coated according to this invention. Therein is illustrated a glass article (substrate) G and a five-layer system A–E. The layering system and its various combinations will be described hereinbelow. First, however, it should be understood that glass substrate G may take many forms and be of many types. Preferably, however, in the practice of this invention glass substrate G is typical float glass, either clear or tinted. Green tinting has been found to be particularly preferred in the practice of this invention when glass substrate G is a vehicular privacy glass window (shown here in FIG. 1 in partial sectional view).

In certain embodiments of this invention coating layers A and B are optional. Coating layer C is the metallic layer envisioned in the practice of this invention, which metallic layer consists essentially of nickel or a high nickel content, non-siliceous alloy (i.e. a non-siliceous nickel alloy having a nickel content of greater than about 50% by weight, and most preferably greater than about 70% by weight).

Envisioned within the scope of this invention is not only pure nickel, but nickel alloys such as Inconel, nichrome, and other well known high content nickel alloys. Particularly preferred for the purposes of this invention, however, is the high content non-siliceous nickel alloy known as Haynes No. 214. Such an alloy has a nominal composition as described hereinabove.

Layer D is a particularly important layer for the purposes of the practice of this invention in that it serves not only as a tight bonding mechanism between layers C and E but it is also believed to add significantly to the heat treatable characteristics of the preferred embodiments of this invention. Layer D, in this respect, is a separate layer formed by sputter-coating and may consist essentially of either elemental silicon (Si) or an oxide (preferably stoichiometric) of a metal selected from nickel (Ni), or an alloy (preferably non-siliceous) having greater than about 50% by weight nickel. In particularly preferred embodiments of this invention layer D is a separately formed oxide layer whose metal is the same metal as has been employed in forming layer C.

Layer E is a protective layer which is a metal oxide (preferably stoichiometric) of a metal selected from the group consisting of zinc, titanium, tin, and alloys thereof. However, in the preferred forms of this invention this protective layer E consists essentially of stoichiometric tin oxide ($Sn\ O_2$).

The above three layers constitute the essential layers found in the practice of this invention. However, certain optional layers may be added, and in the preferred embodiments of this invention, they have been found to add significant improving characteristics to certain products as envisioned within the scope of this invention. In this respect, layer A is yet another protective layer which also serves to bond layer B to the glass substrate. Thus layer A should have the characteristic of not only protecting the layered system from undesirable effects from the glass substrate G, but also will serve as a tight bonding agent between substrate G and layer B. In the preferred embodiments of this invention layer A may be selected from the same group of oxides as is layer E, and in particularly preferred embodiments it is the same metallic oxide employed as layer E, and in this respect, is most preferably stoichiometric tin oxide ($Sn\ O_2$).

Optional layer B serves the same function as layer D except that it now tightly bonds layer C to layer A.

Layer B may be selected from the same metal oxides as are employed in making layer D, and in this respect, in its preferred embodiments, constitutes an oxide of the same metal employed as the metal in layer C. In the most preferred forms, of course, the metal of layers B, C, and D is Haynes 214, while that of layers A and E is tin.

Figure 2:
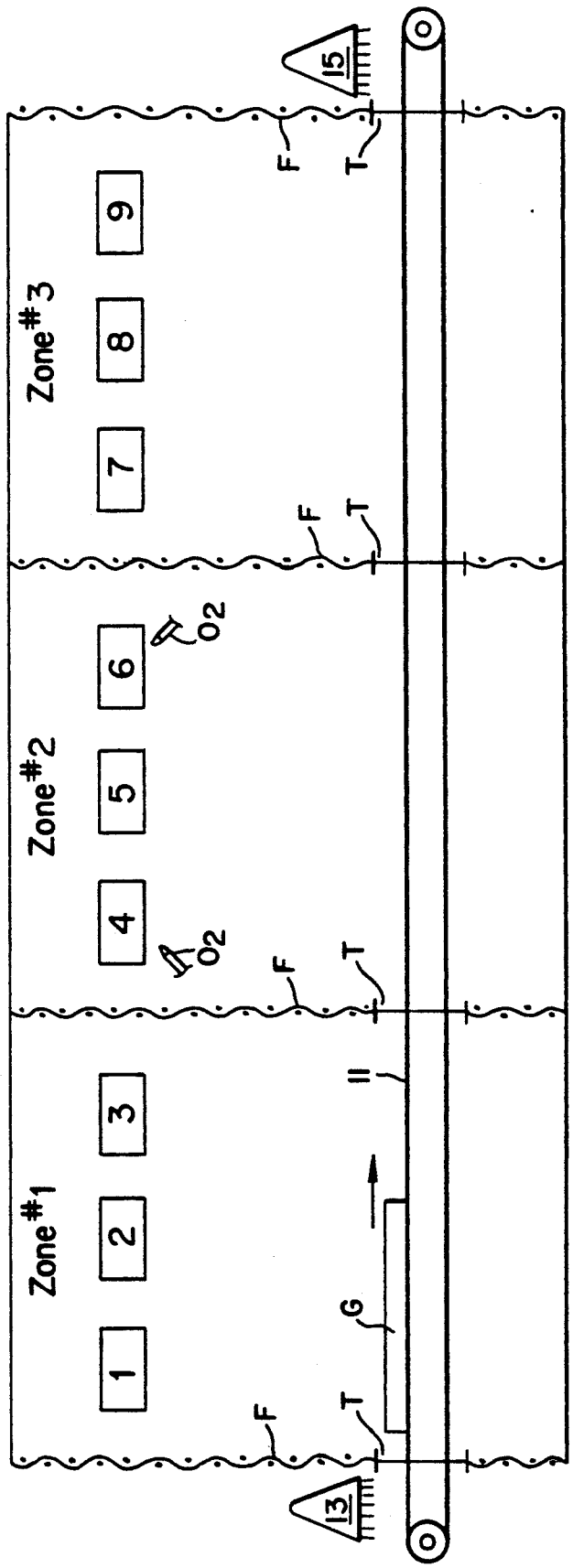
FIG. 2 is a schematic of an Airco-Temescal three-zone architectural sputter-coater useful in carrying out an embodiment of this invention.

The technique for coating employed in this invention may be any of the known coating methods, but in particularly preferred forms it is the aforementioned sputter-coating techniques which, in carrying out the invention, may be practiced by the use of any conventional sputter-coater, such as a conventional Airco-Temescal multi-zone architectural sputter-coater of known design. As shown in FIG. 2, this sputter-coater may take its conventional form wherein there are employed three targets in each of three zones, thus resulting in targets 1–9. Glass substrate G, herein shown as a flat glass sheet (e.g. in the shape of a flat, yet to be bent and/or tempered vehicular privacy window) is conveyed on conveyor 11 (roller type only schematically shown) through the Airco sputter-coater whose zones are separated in a known fashion by walls F having in their lower extremity an adjustable tunnel T. Pre-wash 13 and post-wash 15 are conventionally provided.

Because of these tunnels T in walls F, oxide coatings can be formed at the interface with proper regulation of pressures or selective addition of oxygen at nozzles $O_2$, while the substantially non-oxidized metallic layer can be formed in the middle of Zone 2. Thus, for example, with reference to applying the coating of FIG. 1 as the coating on substrate G as it progresses through the three-zone apparatus shown in FIG. 2, all three targets 1–3 may be of the same protective metal (e.g. tin). In this situation, the pressure in Zone 1 may be regulated to approximately $2-3 \times 10^{-3}$ Torr with an 80% $O_2$ and 20% argon atmosphere. Zone 2 may then have as its targets the various elements desired for layers B, C, and D, while Zone 3 will have the metal desired for layer E. By applying a pressure in Zone 2 less than in Zone 1, and using 100% argon as the atmosphere (and/or selectively using oxidizing nozzles $O_2$), and thereafter applying a pressure of $1.0 \times 10^{-3} - 3 \times 10^{-3}$ Torr in Zone 3, five layers may be formed as shown in FIG. 1 in the following manner:

As glass G progresses through Zone 1 at its aforesaid pressure, stoichiometric tin oxide is applied to the glass as layer A if this optional layer is desired. By creating a higher pressure in Zone 1 than Zone 2, oxygen flows into Zone 2 and/or the first nozzle $O_2$ is opened, such that if target 4 is to be employed to create optional layer B, the coating therefrom will be oxidized (preferably stoichiometrically). Target 4, in this respect, can be formed of nickel, Inconel, nichrome, Haynes 214, or other high content nickel alloys.

Insufficient oxygen is allowed to reach the area under target 5 so that essentially pure metal is now formed as a layer C on top of separately formed layer B. Thus target 5 can be the same as target 4, or within the same class as described. If, now, layer D is desired to be silicon, then target 6 is made of silicon and Zone 3 may be controlled at a pressure lower than that in Zone 2 (e.g. $1 \times 10^{-3}$ Torr) and second nozzle $O_2$ is closed, such that essentially unoxidized silicon is formed as layer D. If, on the other hand, it is now desired to form layer D of the same oxide as layer B, then the pressure in Zone 3 is made to exceed that in Zone 2 (e.g. $3 \times 10^{-3}$ Torr) and/or second nozzle $O_2$ is opened, so that an oxide (preferably stoichiometric) is created as layer D. Here, when not silicon, target 6 is conveniently of the same material or class of material as target 4 (and preferably the same as target 5 as well).

As glass G then progresses into Zone 3, targets 7, 8 and 9 provide the protective metal oxide coating (e.g. stoichiometric Sn $O_2$, the same as layer A). This, then, completes the heat treatable coating system. Engaging from the end of Zone 3 is a tightly adhering, excellent coating system having outstanding levels of the eight characteristics including mechanical durability as listed above. It is to be pointed out, in this respect, that in the circumstances of this invention, whether using clear float glass or the preferred green tinted float glass, layer C, in whatever form employed, does not change the index of refraction of the glass substrate either before or during the heat treatment.

It is apparent from the drawing in FIG. 2 that other permutations and combinations of the targets may be employed. For example, rather than relying upon pressure differentials between the zones, and/or the use of nozzles $O_2$, it may be desirable to use targets 3 and/or 7 for a purpose other than to help create the protective layer. In one embodiment then, targets 1–2 and 8–9 may be Sn, while targets 3–7 are Haynes 214. By using substantially equal pressures in the zones (and/or not employing either target 4 or target 6) a five-layer system as envisioned by this invention is formed, because the Haynes 214 oxide is now created in the same zone where the Sn $O_2$ layers are formed. In another embodiment, of course, target 6 could be Si and target 7 could be inoperable, thus creating another layer system within the scope of this invention. Various other combinations will be apparent to the skilled artisan once given this disclosure.

FIG. 3 illustrates an alternative procedure for creating the above-described layering system. In this embodiment a conventional five-zone Airco-Temescal sputter-coater is employed. Nine targets, 1–9, of fifteen targets may be used (or all 15 targets can be used). In this embodiment, furthermore, targets 1–3 and 7–9 are preferably of the metal to be employed as the protective oxide (e.g. preferably stoichiometric tin oxide, Sn $O_2$) and, of course, the various permutations and combinations as suggested above may be substituted here, because 15 targets are available.

The difference, then, between this embodiment and that of FIG. 2 is that by employing a separate zone for each individual layer, differential pressures and/or the use of special oxidizing nozzles $O_2$ need not be employed. All that is normally needed, in this respect, is the control of the appropriate atmosphere in a known fashion to achieve the desired result in any given zone. For example, a nominal pressure of about $2 \times 10^{-3}$ Torr may be employed in all five zones and thereafter, by employing either a 100% argon atmosphere, or an atmosphere of 80% $O_2$ and 20% argon, either an essentially metallic layer (100% argon) or a stoichiometric oxide coating (80% $O_2$, 20% Ar) may be formed. In this respect, of course, it is understood that, if desired, differential pressures and/or nozzles $O_2$ (not shown) may be selectively used as they were described with respect to the embodiment of FIG. 2, to achieve a particular result. It is also understood, with regard to both embodiments, that the number of targets employed may be varied to achieve a particular result such as thickness, speed, etc. All of this is well known to the skilled artisan familiar with the technique of sputter-coating.

While thicknesses can be varied to achieve the desired end result, in accordance with simple trial and error techniques, it is preferred for the purposes of this invention to maintain the layers within the following general ranges:

| Layer | Thickness (Angstroms) |
|---|---|
| A | about 0–1000 (>1 when used) |
| B | about 0–100 (>5 when used) |
| C | about 20–250 |
| D | about 5–100 |
| E | about 20–1000 |

While the actual mechanism by which the subject inventive concept and its unique layering systems achieves the high degree of heat treatability and, at the same time, mechanical durability, is not fully understood, nevertheless it is believed that the following condition nd purposes apply in the normal situation:

| | Purposes of Layers |
|---|---|
| Layer E: | a) Reduces oxidation of metallic layer C during heat treatment |
| | b) Increases abrasion resistance of layer stack |
| | c) Increases chemical resistance of layer stack |
| | d) Adjust optical characteristics of layer stack |
| Layer D: | a) Promotes adhesion between layer E and layer C |
| | b) Slightly adjusts optical characteristics of layer stack |
| | c) Increases chemical resistance of layer system |
| Layer C: | a) Reflects infrared radiation |
| | b) Reflects visible light |
| | c) Reduces solar energy transmission |
| | d) Reduces visible light transmission |
| | e) Resists high temperature oxidation during heat treatment |
| Layer B: | a) Promotes adhesion between layer C and layer A |
| | b) Slight adjustments to optical characteristics of layer stack |
| | c) Increases chemical resistance of layer system |
| Layer A: | a) Reduces visible light reflectance on glass side (anti-reflective) |
| | b) Reduces interaction between layer C and glass substrate at high temperatures |
| | c) Reduces sensitivity of layer C to light stain on surface of glass (glass corrosion by moisture) |
| | d) Increases chemical resistance of layer system |
| | e) Adjust color |

EXAMPLE 1

(FIG. 2, Targets 1–3, 7–9 are Sn; Targets 4–6 are Haynes 214 alloy. Glass: Green Tinted Float Glass)

| Typical Process Conditions: | (Preferred) |
|---|---|
| Layer E: | |
| Working Gases - argon and oxygen | (80% $O_2$, 20% Ar) |
| Gas Pressure - 0.5 to 5.0 × $10^{-3}$ Torr | (1.0 × $10^{-3}$ Torr) |
| Target Voltage - 200–800 volts | (393 volts) |
| Target Amperage - varies | (7.4 amps) |
| Target Power - varies | (2.9 kw) |
| Layer D: | |
| Working Gases - argon and oxygen | (50% $O_2$, 50% Ar) |
| Gas Pressure - 0.5 to 5.0 × $10^{-3}$ Torr | (8.9 × $10^{-4}$ Torr) |
| Target Voltage - 200–800 volts | (347 volts) |
| Target Amperage - varies | (7.4 amps) |
| Target Power - varies | (2.6 kw) |
| Layer C: | |
| Working Gases - argon and oxygen | (14% $O_2$, 86% Ar) |
| Gas pressure - 0.5 to 5.0 × $10^{-3}$ Torr | (7.7 × $10^{-4}$ Torr) |
| Target Voltage - 200–800 volts | (407 volts) |
| Target Amperage - varies | (7.9 amps) |
| Target Power - varies | (3.2 kw) |
| Layer B: (Same as Layer D) | |
| Layer A: (Same as Layer E) | |

Typical Optical Electrical Properties (Properties Reported on 5/32" (4.0 mm) Green Tinted Float Glass) [After firing in tempering furnace]

| | |
|---|---|
| Visible Transmission: | 22–23% Ill. C, 2° observer |
| Visible Reflectance (glass side): | 11–12% Ill. C, 2° observer |
| Visible Reflectance (film side): | 31–33% Ill. C, 2° observer |
| Visible Color (glass side): | Gray a = 0.5, b = 0.8 |
| Visible Color (film side): | Gold a = 1.0, b = 24.0 |
| Emissivity: | 0.37–0.38 |
| Sheet Resistance: | 35–37 OHMS per square |
| Solar Transmission: | 13–14% |
| Solar Reflectance: | 10% |

EXAMPLE 2

(FIG. 2, Targets 1–3, 8–9 are Sn; Targets 4–7 are Haynes 214 alloy, but Target 7 is not operable. Glass was 5/32" tinted float glass.)

| | | | | | | Typical Process Conditions: | |
|---|---|---|---|---|---|---|---|
| Zone | Target | Kw | Volts | Amps | Mat'l. | Pressure | Atmosphere ($O_2$ %/Ar %) |
| 1 | 1 | 20 | 421 | 45 | Sn | 2 × $10^{-3}$ (Torr) | 80/20 |
| 1 | 2 | 19 | 428 | 45 | Sn | " | " |
| 1 | 3 | 19 | 427 | 45 | Sn | " | " |
| 2 | 4 | 2 | 348 | 10 | 214 | " | 100% Ar (background $O_2$) |
| 2 | 5 | 17 | 515 | 31.5 | 214 | " | 100% Ar |
| 2 | 6 | 5 | 371 | 10 | 214 | " | 100% Ar (background $O_2$) |
| 3 | 7 | — | — | — | 214 | " | 80/20 |
| 3 | 8 | 14 | 390 | 21 | Sn | " | " |
| 3 | 9 | 12 | 399 | 34 | Sn | " | " |

In this example nozzles $O_2$ are employed at the fourth and sixth target (e.g. sccm about 149) to insure oxidation of the Haynes 214 alloy at these locations. The tinted glass employed was a conventional green tinted float glass having a transition temperature for tempering, hardening and/or bending purposes of approximately 1140° F. –1160° F. Washer speed was set at 70.0% and gas bleed/background in the three zones were (sccm) 1099/275, 480/149, and 893/222, respectively. In Zone 2 background tubes (i.e. nozzles O₂) were operable only for targets 4 and 6. To insure substantially no oxidation of the Hayes 214 at target 5, the voltage was maintained at greater than 505 volts. The resulting coating was a five-layered system from glass outwardly consisting essentially of: Sn O₂/ 214 oxide/214 metallic/214 oxide/Sn O₂. All oxides were believed to consist essentially of stoichiometric oxide.

This glass structure in the form of an unbent vehicular privacy window boardered by a typical boarder paint (e.g. Degussa paint) was then subjected to a conventional tempering and bending operation (i.e. slump and press) at oven temperatures of about 1240° F.–1330° F. for times sufficient to achieve the final product. The result was an excellent privacy window appearing neutral gray from the glass side and gold from the coating side, with excellent durability characteristics.

EXAMPLE 3

A privacy window similar to that of Example 2 was created using the procedures set forth in Example 2, except that target 6 was rendered inoperative and target 7 was employed. An excellent, durable vehicular privacy window was As can be seen from the above, the unique systems and methods of this invention achieve excellent mechanical durability, optical, and heat treatable characteristics. Once given the above disclosure, therefore, various other modifications, features or improvements will become apparent to the skilled artisan. Such other features, modifications and improvements are thus considered a part of this invention, the scope of which is to be determined by the following claims:

We claim:

1. A heat treatable glass article comprised of a glass substrate having thereon a coating which includes:
    a) a first layer having a thickness of abut 5–100Å and comprised of an oxide or nitride of a metal selected from the group consisting of nickel and a nickel alloy having at least about 50% by weight nickel;
    b) a second layer having a thickness of abut 20–250Å and comprised of a metal selected from the group consisting of nickel and a nickel alloy having at least about 50% by weight nickel;
    c) a third layer having a thickness of about 5–100Å and comprised of an oxide or nitride of a metal selected from the group consisting of nickel and a nickel alloy having at least about 50% by weight nickel; and
    d) a fourth layer having a thickness of about 20–1000Å and comprised of an oxide of a metal selected from the group consisting of tin, zinc, titanium and alloys thereof.

2. A heat treatable glass article comprised of a glass substrate having thereon a coating which includes:
    a) a first layer having a thickness of about 1–1000Å and comprised of an oxide of a metal selected from the group consisting of tin, zinc, titanium and alloys thereof.
    b) a second layer having a thickness of about 5–100Å and comprised of an oxide or nitride of a metal selected from the group consisting of nickel and a nickel alloy having at least about 50% by weight nickel;
    c) a second layer having a thickness of abut 20–250Å and comprised of a metal selected from the group consisting of nickel and a nickel alloy having at least about 50% by weight nickel;
    d) a fourth layer having a thickness of about 5–100Å and comprised of an oxide or nitride of a metal selected from the group consisting of nickel and a nickel alloy having at least about 50% by weight nickel; and
    A fifth layer having a thickness of about 20–1000Å and comprised of an oxide of a metal selected from the group consisting of tin, titanium and alloys thereof.

3. A heat treatable glass article according to claim 2 wherein said first and fifth layers consist essentially of tin oxide.

4. A heat treatable lass article according to claim 2 wherein the metal of said second, third and fourth layers is the same metal.

5. A heat treatable glass article according to claim 4 wherein the first and fifth layers consist essentially of stoichiometric tin oxide.

6. A heat treatable glass article according to claim 5 wherein said metal of said second, third, and fourth layers consists essentially of an alloy having greater than about 70% Ni by weight.

7. A heat treatable glass article according to claim 2 wherein said first and fifth layers consist essentially of stoichiometric tin oxide, said third layer consists essentially of an alloy comprised of Ni, Fe, Cr, C, Al and Y, and said second and fourth layers consist essentially of an oxide of said alloy of the third layer.

8. A heat treatable glass article according to claim 6 wherein said alloy of said third layer consists essentially of:

| ELEMENT | Wt % |
|---------|------|
| Ni | about 75.45 |
| Fe | about 4.00 |
| Cr | about 16.00 |
| C | about .04 |
| Al | about 4.50 |
| Y | about 0.01 |

9. A heat treatable glass article according to claim 2 wherein said glass substrate is green tinted float glass.

10. A heat treatable sputter-coated glass article comprising a glass substrate having thereon a layer system which includes:
    a) a substantially-oxidized metallic layer (a) formed of nickel or a nickel alloy having greater than about 50% by weight nickel and having a thickness of about 20–250Å;
    b) a metallic oxide protective layer (b) wherein the metal in the metallic oxide is different than the metal in layer (a) and having a thickness of about 20–1000Å; and
    c) a separate layer (c) intermediate layers (a) and (b) consisting essentially of metallic silicon or a metallic oxide or nitride wherein the metal in the metal oxide or nitride is nickel or a nickel alloy having greater than about 50% by weight nickel, and wherein layer (c) tightly bonds layer (a) to layer (b) and has a thickness of about 5–100Å.

11. A heat treatable sputter-coated glass article according to claim 10 wherein the metal in the oxide of said layer (c) is the same metal as in layer (a).

12. A heat treatable sputter-coated glass article according to claim 11 wherein said layer (b) consists essentially of stoichiometric tin oxide ($SnO_2$).

13. A heat treatable sputter-coated glass article according to claim 12 which further includes layers (d) and (e), wherein layer (c) is a metallic oxide or nitride of nickel or a nickel alloy having greater than about 50% by weight nickel, and wherein layer (e) has a thickness of about 1–1000Å and is the same metallic oxide as layer (b), and layer (d) has a thickness of about 5–100Å and is the same metallic oxide or nitride as layer (c), and wherein layer (e) bonds layer (d) tightly to said glass substrate, and layer (d) bonds layer (e) tightly to layer (a).

14. A heat treatable sputter-coated glass article according to claim 13 wherein said article is a vehicular privacy window.

* * * * *

UNITED STATES PATENT AND TRADEMARK OFFICE
CERTIFICATE OF CORRECTION

PATENT NO. : 5,229,194
DATED : July 20, 1993
INVENTOR(S) : Lingle et al

It is certified that error appears in the above-indentified patent and that said Letters Patent is hereby corrected as shown below:

In claim 2, col. 11, line 61, change "." to --;--.

In claim 2, col. 11, line 67, change "second" to --third--.

Column 11, line 67, change "abut" should read --about--

Signed and Sealed this

Twenty-second Day of March, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,229,194
DATED : July 20, 1993
INVENTOR(S) : Philip J. Lingle, et al It is certified that error appears in the above-indentified patent and that said Letters Patent is hereby corrected as shown below:

Column 4, line 38, after "tin" insert --zinc, --.
Column 12, line 10, claim 2, after "tin," insert --zinc,--.

Signed and Sealed this

Twenty-sixth Day of April, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,229,194
DATED : July 20, 1993
INVENTOR(S) : Lingle et al.

It is certified that error appears in the above-identified patent and that said Letters Patent is hereby corrected as shown below:

In col. 8, line 8 delete "Engaging" and insert therefor -- Emerging --.

In col. 8, line 21 before differentials delete "25".

In col. 9, line 19 change "condition nd" to -- conditions and --.

In col. 11, line 26 after was insert -- obtained. --.

In claim 1, col. 11, line 39 change "abut" to -- about --.

In claim 1, col. 11, line 43 change "abut" to -- about --.

In claim 2, col. 12, line 8 before A insert -- e) --.

In claim 2, col. 12, line 8 change "A" to -- a --.

In claim 10, col. 12, line 50 change "substantially-oxidized" to -- substantially non-oxidized --

Signed and Sealed this

Seventh Day of June, 1994

Attest:

BRUCE LEHMAN

Attesting Officer

Commissioner of Patents and Trademarks